United States Patent [19]

Chang et al.

[11] Patent Number: 4,764,477

[45] Date of Patent: Aug. 16, 1988

[54] CMOS PROCESS FLOW WITH SMALL GATE GEOMETRY LDO N-CHANNEL TRANSISTORS

[75] Inventors: Kuang-Yeh Chang, Austin; Charles F. Hart, Pflugerville, both of Tex.

[73] Assignee: Motorola, Inc., Del.

[21] Appl. No.: 34,197

[22] Filed: Apr. 6, 1987

[51] Int. Cl.$^4$ .................... H01L 27/02; H01L 29/78
[52] U.S. Cl. ........................ 437/29; 437/34; 437/44; 437/57
[58] Field of Search ............ 437/56, 57, 58, 44, 437/29, 34

[56] References Cited

U.S. PATENT DOCUMENTS

| | | | |
|---|---|---|---|
| 4,084,311 | 4/1978 | Yasuoka et al. | 357/42 X |
| 4,577,391 | 3/1986 | Hsia et al. | 357/23.9 |
| 4,590,663 | 5/1986 | Haken | 437/57 |
| 4,717,684 | 1/1988 | Katto et al. | 437/34 |

OTHER PUBLICATIONS

Lee et al., IEDM Tech. Digest, Electron Devices Meeting, Washington, D.C. (Dec.1985), pp. 242–245.

*Primary Examiner*—Olik Chaudhuri
*Attorney, Agent, or Firm*—John A. Fisher; Jeffrey Van Myers; Robert L. King

[57] ABSTRACT

A process for forming lightly doped drains in a CMOS circuit utilizing two photoresist masks is disclosed. After gates for N-channel and P-channel transistors have been formed, an N-implant is effected. A first photoresist mask is used as a source/drain implant is made for the P-channel transistor. Sidewall spacers are formed for the gates of both transistors. A second photoresist mask is used as a source/drain implant is made for the N-channel transistor. The resulting CMOS circuit has an N-channel transistor with a lightly doped drain and a P-channel transistor without a lightly doped drain.

3 Claims, 6 Drawing Sheets

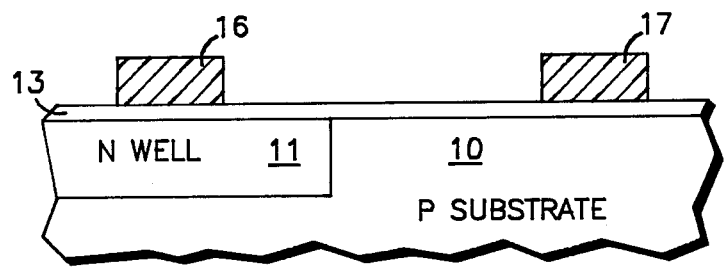
FIG. 1A —PRIOR ART—
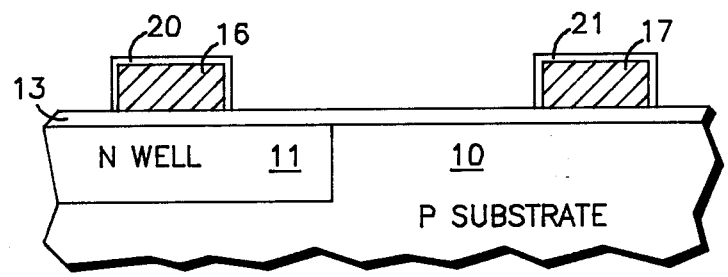
FIG. 1B —PRIOR ART—
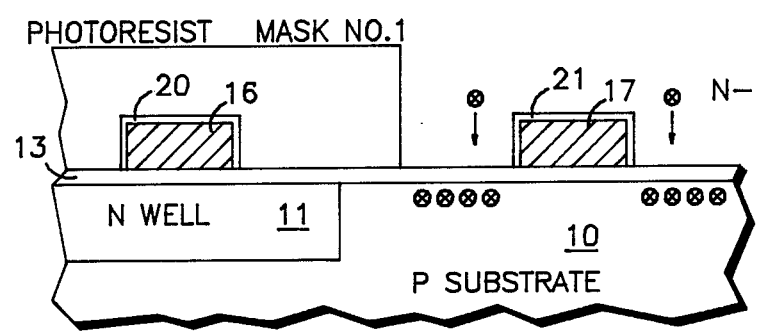
FIG. 1C —PRIOR ART—

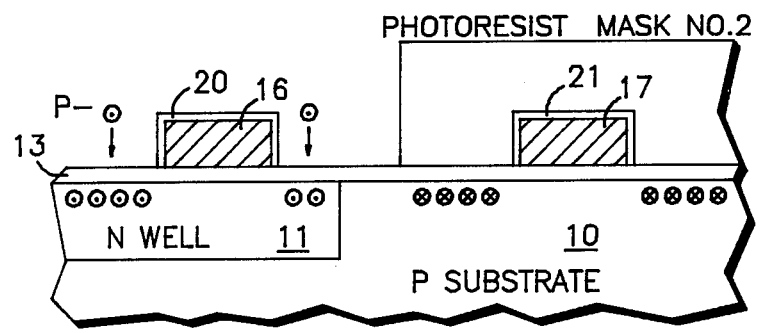
FIG. 1D —PRIOR ART—
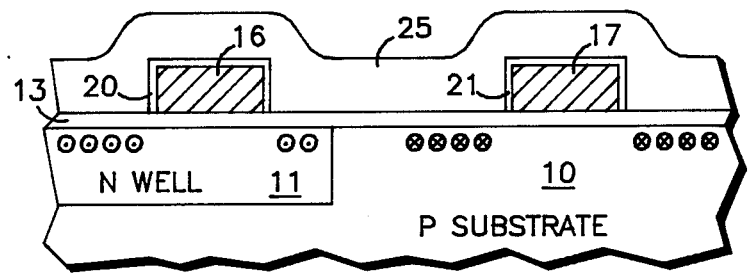
FIG. 1E —PRIOR ART—
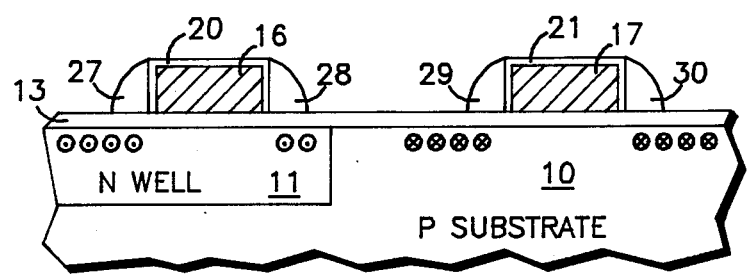
FIG. 1F —PRIOR ART—

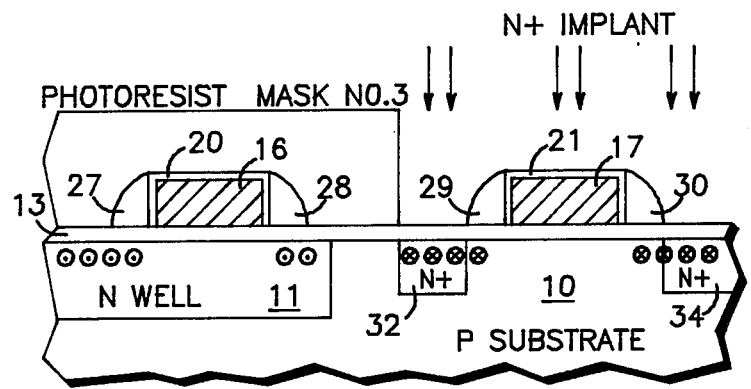
FIG. 1G —PRIOR ART—
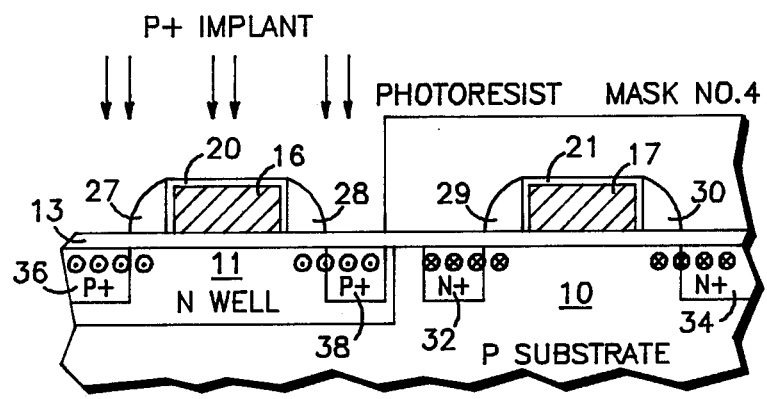
FIG. 1H —PRIOR ART—

CMOS PROCESS FLOW WITH SMALL GATE GEOMETRY LDO N-CHANNEL TRANSISTORS

TECHNICAL FIELD

This invention relates generally to electronic process flows, and more particularly, to CMOS lightly doped drain (LDD) electronic processes.

BACKGROUND ART

The LDD process utilizes a lightly doped source/drain region that is driven into a substrate adjacent the gate region of a transistor while the heavily doped drain and source regions are laterally displaced away from the gate by use of a sidewall spacer on the gate. Some minor lateral diffusion under the gate of the light dopant may occur but LDDs typically avoid conventional problems with excess lateral or vertical impurity diffusion. LDDs have been developed to reduce hot electron induced device degradation effect in N-channel transistors resulting from short channel lengths. Hot carrier instability is a conventional problem which is the injection of either electrons or holes into the gate resulting from high electrical fields between the source and drain. The problem may be particularly acute near the drain where impact ionization occurs. High energy or hot carriers are injected into the gate dielectric resulting in a combination of threshold voltage shift, mobility degradation and increased series resistance depending upon the type of device structure.

In a conventional LDD process, the lightly doped regions are implanted into the substrate after the gate has been formed but prior to sidewall spacer formation. A dielectric is typically deposited after the gate has been formed and removed from the horizontal surfaces using anisotropic etching. A sidewall spacer having a roughly quarter-circular cross-section is typically formed. A heavy source/drain dopant is then implanted with the gate and sidewall spacer acting as a mask to provide source and drain regions laterally displaced from the gate edges by the thickness of the sidewall spacer. The conventional LDD process requires the use of four photoresist masks, which makes the process expensive and increases the likelihood of errors during manufacture. The conventional LDD process also requires a p- region under the sidewall spacer of a P-channel transistor's gate. Adding the lightly doped drain to P-channel transistors adds extra resistance to the source/drain regions. In general, the LDD process is not very beneficial to P-channel devices since a P-channel transistor is not noticeably degraded by the hot carrier phenomena due to the difference between electron and hole mobility.

BRIEF DESCRIPTION OF THE INVENTION

Accordingly, an object of the present invention is to provide an improved method and apparatus for minimizing masking steps in an LDD CMOS process flow.

Another object of the present invention is to provide an improved semiconductor process for large scale integration.

Yet another object of this invention is to provide an improved method for simplifying fabrication of an LDD CMOS process.

In carrying out the above and other objects of the present invention, there is provided, in one form, a process for forming lightly doped drains (LDD) in a CMOS circuit. A first gate is formed for a first MOS device on a first area of first conductivity type of an integrated circuit substrate. A second gate is formed for a second MOS device on a second area of second conductivity type of the substrate. A barrier material over the first and second gates is selectively formed. A lightly doped material of the first conductivity type is implanted into an upper surface of the first and second areas of the substrate adjacent to but not beneath the first and second gates. A first disposable barrier material is formed over selected areas of the substrate including the second gate and excluding the first gate. Heavily doped source/drain regions are then implanted along side edges of the first gate while the second gate is protected by the first disposable barrier material. The first disposable barrier material is removed from over the selected areas of the substrate. Sidewall spacers are formed along side edges of the first and second gates. A second disposable barrier material is formed over selected areas of the substrate including the first gate and excluding the second gate. Heavily doped source/drain regions are implanted along sidewall spacer edges of the second gate. The second disposable barrier material is then removed from over the selected areas of the substrate.

These and other objects, features and advantages will be more clearly understood from the following detailed description taken in conjunction with the accompanying drawings.

BRIEF DESCRIPTION OF THE DRAWINGS

FIGS. 1(a)–(h) are schematic, cross-sectional illustrations showing the various stages of a conventional lightly doped drain process using four photoresist masks.

DETAILED DESCRIPTION OF THE INVENTION

Figure 2A:
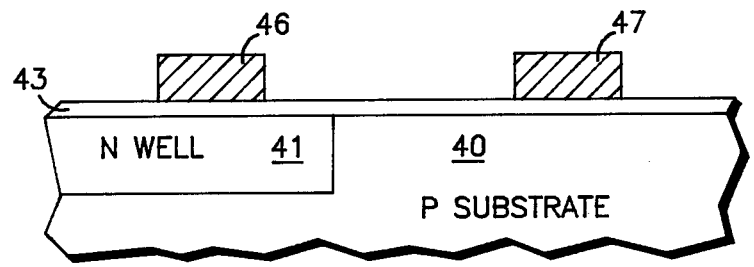
FIGS. 2(a)–(g) are schematic, cross-sectional illustrations showing the various stages of a lightly doped drain process in accordance with the present invention.

Shown in FIG. 1(a) is a cross-sectional illustration of initial fabrication of a pair of LDD transistors of opposite conductivity type. A substrate material 10 having a P-type conductivity is provided in which a well region 11 of N-type conductivity is formed. A gate oxide region 13 is formed over substrate 10 and well region 11. Gate oxide region 13 typically has a thickness of between two hundred fifty and four hundred Angstroms. Polysilicon gate regions 16 and 17 are formed on gate oxide 13 above well region 11 and substrate 10, respectively. The formation of gate regions 16 and 17 by deposition and selective etching is a conventional process technique and will not be discussed in further detail.

Shown in FIG. 1(b) is a cross-sectional illustration detailing the result of a second step in the conventional fabrication of LDD transistors. For convenience of illustration, commonly duplicated elements in FIGS. 1(a) thru 1(h) will be consistently identified by the same number. A screen oxide 20 and 21 has been formed on gate regions 16 and 17, respectively, by conventional thermal oxidation. A conventional thickness of the screen oxide is approixmately one hundred fifty angstroms on silicon and approximately four hundred fifty angstroms on polysilicon.

Shown in FIG. 1(c) is a cross-sectional illustration detailing a third step in the conventional fabrication of LDD transistors. A first photoresist mask is utilized to effectively mask off screen oxide 20, gate region 16 and well region 11. An N− conductivity implant represented by an encircled "X" is implanted into the upper surface of substrate 10 in the areas where the first photoresist mask and the screen oxide 21 do not block the implant dopant from diffusing into substrate 10. In one form, a conventional N− implant material of phosphorous at forty thousand electron volts and $5 \times 10^{13}$ atoms per square centimeter may be used.

Shown in FIG. 1(d) is a cross-sectional illustration detailing a fourth step in the conventional fabrication of LDD transistors. A second photoresist mask is utilized to effectively mask off screen oxide 21 and gate region 17. A P− conductivity implant represented by an encircled dot is implanted into the upper surface of well region 11 in the areas where the second photoresist mask and the screen oxide 20 do not block the implant dopant from diffusing into well region 11. A conventional P− implant material which is used is boron at thirty thousand electron volts and $1 \times 10^{14}$ atoms per square centimeter.

Shown in FIG. 1(e) is a cross-sectional illustration detailing a fifth step in the conventional fabrication of LDD transistors. An undoped low temperature oxide 25 (LTO) is deposited over the entire upper surface of the semiconductor surface. A typical LTO deposition thickness varies between one and six thousand Angstroms.

Shown in FIG. 1(f) is a cross-sectional illustration detailing a sixth step in the conventional fabrication of LDD transistors. An anisotropic oxide spacer etch is performed by etching the low temperature oxide 25 to form sidewall spacers. As a result of the anisotropic oxide spacer etch, sidewall spacers 27 and 28 are formed on the sides of gate region 16 and sidewall spacers 29 and 30 are formed on the sides of gate region 17. It should be well understood that screen oxide 13 is typically etched away by the anisotropic oxide spacer etch except beneath the gate regions and sidewall spacers. Therefore, screen oxide 13 must be reformed in those areas to produce the structure illustrated in FIG. 1f.

Shown in FIG. 1(g) is a cross-sectional illustration detailing a seventh step in the conventional fabrication of LDD transistors. A third photoresist mask is used to mask off the left portion of the semiconductor structure in FIG. 1(g) including gate region 16. The remainder of the semiconductor structure is subjected to a heavy N+ conductivity implant. Screen oxide 21, gate region 17, and sidewall spacers 29 and 30 effectively block the N+ implant radiation. However the N+ implant diffuses into substrate 10 to form N+ source and drain regions 32 and 34, respectively. A typical N+ implant dopant is arsenic at a strength of approximately eighty thousand electron volts and $7 \times 10^{15}$ atoms per square centimeter.

Shown in FIG. 1(h) is a cross-sectional illustration detailing an eighth step in the conventional fabrication of LDD transistors. A fourth photoresist mask is used to mask off the right portion of the semiconductor structure in FIG. 1(g) including gate region 17. The remainder of the semiconductor structure is subjected to a heavy P+ conductivity implant. Screen oxide 20, gate region 16, and sidewall spacers 27 and 28 effectively block the P+ implant radiation. However, the P+ implant diffuses into well region 11 to form P+ source and drain regions 36 and 38, respectively. A typical P+ implant dopant is borine diflouride at a strength of approximately eighty thousand electron volts and $5.5 \times 10^{15}$ atoms per square centimeter.

In the illustrated process, an N-channel and a P-channel MOS transistor have been formed with each transistor having a lightly doped drain. It should be noted that in the channel of the N-channel MOS transistor the N− doping is present in the upper surface and at the outer ends of the channel adjacent each edge of screen oxide 21. However, the source and drain regions 32 and 34 are respectively displaced from the screen oxide 21 by sidewall spacers 29 and 30. The N− doping at the gate edge reduces the electric field at the gate edge which minimizes hot carrier instability problems which exist when the gate width is one micron or less. Similarly, in the channel of a P-channel MOS transistor the P− doping is present in the upper surface and at the outer ends of the channel adjacent each edge of screen oxide 20. However, the source and drain regions 36 and 38 are respectively displaced from the screen oxide 20 by sidewall spacers 27 and 28. Although the P-channel transistor formed by drain 36, source 38 and gate 16 has a lightly doped drain, the lightly doped drain is not necessarily required for reliable circuit operation because hot carrier degradation is much less severe in P-channel transistors due to the difference between electron and hole mobilities.

Shown in FIG. 2(a) is a cross-sectional illustration of initial fabrication of an LDD N-channel transistor in a CMOS process. A substrate material 40 having a P-type conductivity is provided in which a well region 41 of N-type conductivity is formed. A gate oxide region 43 is formed over substrate 40 and well region 41. Gate oxide region 43 has a thickness typically between two hundred fifty and four hundred Angstroms. Polysilicion gate regions 46 and 47 are formed on gate oxide 43 above well region 41 and substrate 40, respectively. The formation of gate regions 46 and 47 by deposition and selective etching is a conventional process technique and will not be further detailed.

Figure 2B:
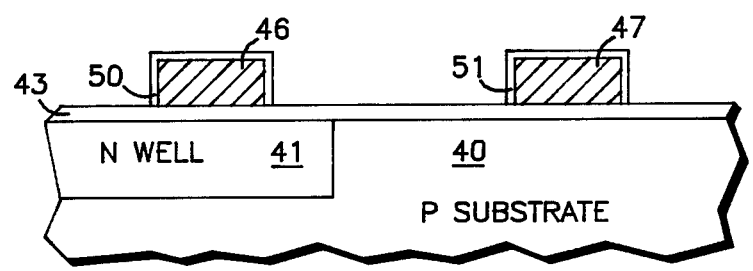

Shown in FIG. 2(b) is a cross-sectional illustration detailing the result of a second step in the process of the present invention. Again, for convenience of illustration, commonly duplicated elements in FIGS. 2(a) thru 2(g) will be consistently identified by the same number. A screen oxide 50 and a screen oxide 51 have been formed on gate regions 46 and 47, respectively, in a manner analogous to the process described in FIG. 1.

Figure 2C:
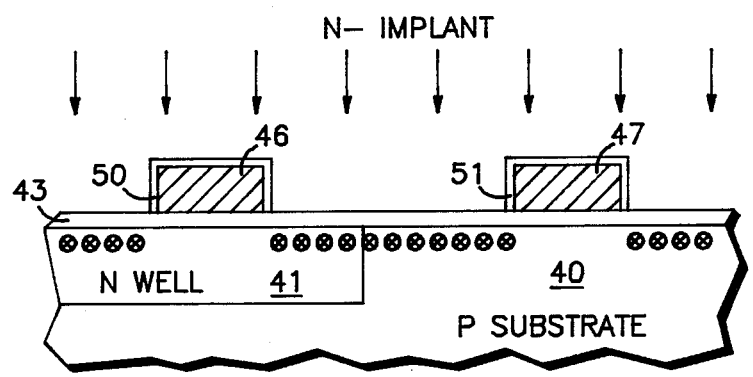

Shown in FIG. 2(c) is a cross-sectional illustration detailing a third step in the process steps of the present invention. An N− conductivity implant represented by an an encircled "X"0 is implanted into the upper surface of substrate 40 and well region 41 in the areas where the screen oxides 50 and 51 do not block the implant dopant from diffusing. A conventional N− implant material such as phosphorous at forty thousand electron volts and $5 \times 10^{13}$ atoms per square centimeter is used.

Figure 2D:
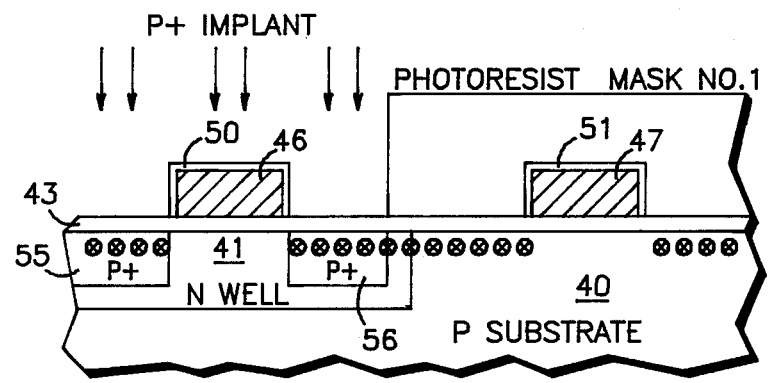

Shown in FIG. 2(d) is a cross-sectional illustration detailing a fourth step in the process steps of the present invention. A first photoresist mask is utilized to effectively mask off a portion of well region 41, substrate 40 and screen oxide 51. A P+ conductivity implant is implanted into the remaining portion of the semiconductor structure which is not masked. The P+ implant is blocked by screen oxide 50 and gate region 46 but results in the formation of P+ source and drain regions 55 and 56, respectively, in the upper surface of well region 41. The source and drain regions 55 and 56 extend laterally along the upper surface of well 41 to each side of screen oxide 50. A typical implant dopant such as borine diflouride at a strength of approximately eighty thousand electron volts and $5.5 \times 10^{15}$ atoms per square centimeter may be used.

Figure 2E:
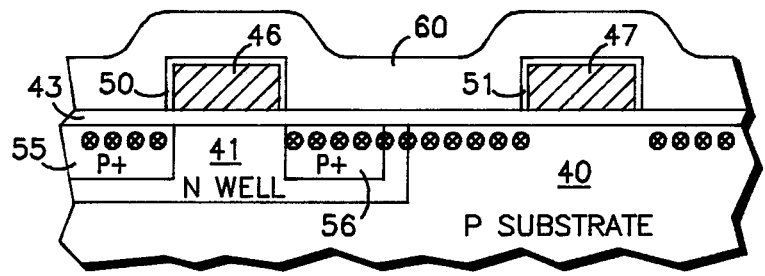

Shown in FIG. 2(e) is a cross-sectional illustration detailing a fifth step in the process steps of the present invention. An undoped low temperature oxide 60 (LTO) is deposited over the entire upper surface of the semiconductor surface. A typical LTO deposition thickness varying between one and six thousand Angstroms may be used.

Figure 2F:
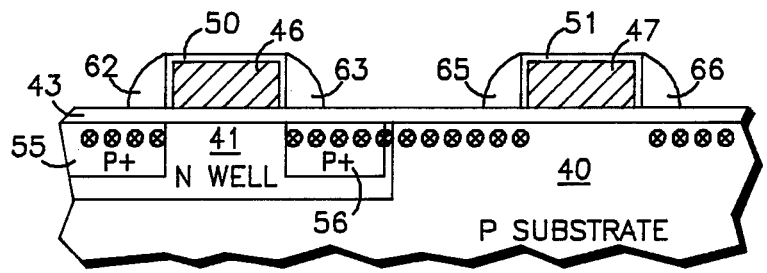

Shown in FIG. 2(f) is a cross sectional illustration detailing a sixth step in the process steps of the present invention. An anisotropic oxide spacer etch is performed by etching the low temperature oxide 60 to form sidewall spacers. As a result of the anisotropic oxide spacer etch, sidewall spacers 62 and 63 are formed on the sides of gate region 46 and sidewall spacers 65 and 66 are formed on the sides of gate region 47. As mentioned in connection with the process of FIG. 1, it should again be well understood that screen oxide 43 is typically etched away by the anisotropic oxide spacer etch except beneath the gate regions and sidewall spacers. Therefore, screen oxide 43 must be reformed in those areas to produce the structure illustrated in FIG. 2(f).

Figure 2G:
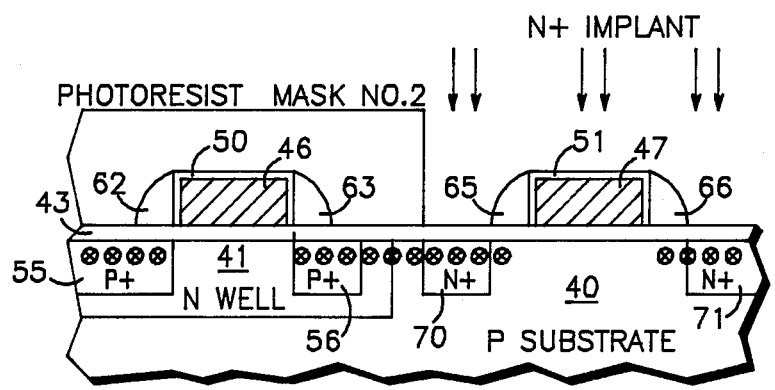

Shown in FIG. 2(g) is a cross sectional illustration detailing a seventh step in the process steps of the present invention. A second photoresist mask is used to mask off the left portion of the semiconductor structure in FIG. 2(g) including gate region 46. The remainder of the semiconductor structure is subjected to a heavy N+ conductivity implant. An N+ implant dopant such as arsenic at a strength of approximately eighty thousand electron volts and $7 \times 10^{15}$ atoms per square centimeter may be used. The N+ implant diffuses into substrate 40 to form N+ source and drain regions 70 and 71, respectively.

In the illustrated process, an N-channel and a P-channel MOS transistor have been formed with the N-channel transistor structure having a lightly doped drain and only two masking steps required. The fact that the P-channel MOS transistor does not have a lightly doped drain as in the prior art process of FIG. 1 is insignificant because the hot carrier problem which a lightly doped drain structure compensates is not significantly present in P-channel transistors. It should be noted that a lightly doped drain structure for an N-channel transistor has been formed without using as many masking steps as was previously used. By not having a lightly doped drain in a P-channel transistor, additional resistance which would be present in the source and drain regions in the process of FIG. 1 is avoided. The reduction of masking steps eliminates fabrication costs and advances production speed and efficiency. It should be further noted that the LDD process of the present invention has not reduced the number of masking steps by resorting to an exotic or complicated process flow. The process steps of the present invention are easily implementable and provide a simple process for small gate geometries.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A process for forming a lightly doped drain (LDD) in a complementary MOS circuit, comprising the sequential steps of:
    forming a first gate for a first MOS device on a first area of first conductivity type of an integrated circuit substrate, and forming a second gate for a second MOS device on a second area of second conductivity type of the substrate;
    selectively forming a barrier material over the first and second gates;
    implanting a lightly doped material of the first conductivity type into an upper surface of the first and second areas of the substrate adjacent to but not beneath the first and second gates;
    forming a first disposable barrier material over selected areas of the substrate including the second gate and excluding the first gate;
    implanting heavily doped source/drain regions along side edges of the first gate while the second gate is protected by the first disposable barrier material;
    removing the first disposable barrier material from over the selected areas of the substrate; forming oxide sidewall spacers along side edges of the first and second gates;
    forming a second disposable barrier material over selected areas of the substrate including the first gate and excluding the second gate;
    implanting heavily doped source/drain regions along oxide sidewall spacer edges of the second gate; and
    removing the second disposable barrier material from over the selected areas of the substrate.

2. The process of claim 1 wherein the first conductivity type is P conductivity and the second conductivity type is N conductivity.

3. A process for forming lightly doped drains (LDDs) in N-channel transistors only in a CMOS circuit, comprising the sequential steps of:
    forming a first gate for a P-channel transistor on a first area of first conductivity type of an integrated circuit substrate, and forming a second gate for an N-channel transistor on a second area of second conductivity type of the substrate;
    selectively forming a barrier material over the first and second gates;
    implanting a lightly doped material of N conductivity into an upper surface of the first and second areas of the substrate adjacent to but not beneath the first and second gates;
    forming a first photoresist mask over selected areas of the substrate including the second gate and excluding the first gate;
    implanting heavily doped P conductivity source/drain regions along side edges of the first gate while the second gate is protected by the first disposable barrier material to form the P-channel transistor;
    removing the first photoresist mask from over the selected areas of the substrate;
    forming oxide sidewall spacers along side edges of the first and second gates;
    forming a second photoresist mask over selected areas of the substrate including the first gate and excluding the second gate;
    implanting heavily doped N conductivity source/drain regions along oxide sidewall spacer edges of the second gate to form the N-channel transistor; and
    removing the second photoresist mask from over the selected areas of the substrate.

* * * * *